(12) United States Patent
Eto et al.

(10) Patent No.: US 9,236,229 B2
(45) Date of Patent: Jan. 12, 2016

(54) GAS SUPPLY MEMBER, PLASMA TREATMENT METHOD, AND METHOD OF FORMING YTTRIA-CONTAINING FILM

(75) Inventors: Hideo Eto, Mie (JP); Rikyu Ikariyama, Kanagawa (JP); Makoto Saito, Mie (JP); Sachiyo Ito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/193,914

(22) Filed: Jul. 29, 2011

(65) Prior Publication Data
US 2012/0037596 A1 Feb. 16, 2012

(30) Foreign Application Priority Data

Aug. 12, 2010 (JP) .................................. 2010-180790
Mar. 18, 2011 (JP) .................................. 2011-060711

(51) Int. Cl.
*H01J 37/02* (2006.01)
*H01J 37/32* (2006.01)
*C23C 16/509* (2006.01)
*C23C 16/455* (2006.01)

(52) U.S. Cl.
CPC ....... *H01J 37/32449* (2013.01); *H01J 37/3244* (2013.01); *H01J 37/32477* (2013.01); *H01J 37/32495* (2013.01); *C23C 16/45565* (2013.01); *C23C 16/5096* (2013.01); *H01J 37/32009* (2013.01); *Y10T 137/87169* (2015.04)

(58) Field of Classification Search
CPC ............ H01J 37/32009; H01J 37/3244; H01J 37/3255; H01J 37/32449; H01J 37/32477; H01J 37/32495; C23C 16/5096; C23C 16/45565

USPC ............. 156/345.33, 345.34, 345.43–345.47; 118/723 E
See application file for complete search history.

(56) References Cited

U.S. PATENT DOCUMENTS

| | | | |
|---|---|---|---|
| 6,334,983 B1 * | 1/2002 | Okayama et al. ........ | 422/186.29 |
| 7,416,635 B2 * | 8/2008 | Moriya et al. ........... | 156/345.34 |
| 7,743,731 B2 * | 6/2010 | Enomoto et al. .......... | 118/723 E |
| 2002/0009560 A1 * | 1/2002 | Ozono ....................... | 428/34.4 |
| 2004/0060661 A1 | 4/2004 | Nishimoto et al. | |
| 2004/0173313 A1 * | 9/2004 | Beach ....................... | 156/345.33 |
| 2005/0255257 A1 * | 11/2005 | Choi et al. ................... | 427/585 |
| 2006/0228496 A1 * | 10/2006 | Choi et al. .................... | 427/569 |

(Continued)

FOREIGN PATENT DOCUMENTS

| | | |
|---|---|---|
| JP | 2006-108178 | 4/2006 |
| JP | 2010-087009 | 4/2010 |
| WO | WO 2008/044555 A1 | 4/2008 |

OTHER PUBLICATIONS

Office Action mailed Oct. 30, 2012, from the Japanese Patent Office in corresponding Japanese Pat. App. No. JP 2011-060711 and English translation thereof (7 pages total).

*Primary Examiner* — William McCalister
*Assistant Examiner* — Ian Paquette
(74) *Attorney, Agent, or Firm* — Finnegan, Henderson, Farabow, Garrett & Dunner, L.L.P.

(57) ABSTRACT

According to one embodiment, a gas supply member is provided with a gas supply passage including a gas flow channel with a first diameter, and an exhaust port connected to one end portion of the gas flow channel and provided to a surface of a downstream side of the gas supply member. An yttria-containing film is formed on a surface constituting the exhaust port and the surface of the downstream side of the gas supply member. At least a part of the surface constituting the exhaust port is formed with a curved surface.

15 Claims, 9 Drawing Sheets

(56) References Cited

U.S. PATENT DOCUMENTS

2007/0096658 A1* 5/2007 Saigusa et al. ........... 315/111.21
2009/0142588 A1* 6/2009 Ohmi et al. ................... 428/336
2009/0285998 A1* 11/2009 Okumura et al. ............. 427/448

* cited by examiner

GAS SUPPLY MEMBER, PLASMA TREATMENT METHOD, AND METHOD OF FORMING YTTRIA-CONTAINING FILM

CROSS-REFERENCE TO RELATED APPLICATIONS

This application is based upon and claims the benefit of priority from the prior Japanese Patent Application No. 2010-180790, filed on Aug. 12, 2010, and the prior Japanese Patent Application No. 2011-60711, filed on Mar. 18, 2011; the entire contents of all of which are incorporated herein by reference.

FIELD

Embodiments described herein relate generally to a gas supply member, a plasma treatment method, and a method of forming an yttria-containing film.

BACKGROUND

Conventionally, in a microfabrication process for manufacturing a semiconductor device, a liquid crystal display device and the like, a reactive ion etching (RIE) apparatus is used. In the RIE apparatus, the inside of a chamber is first adjusted to enter a low pressure state, fluorine-based gas or chlorine-based gas is then introduced into the chamber to generate a plasma phase, and etching is performed. Since a member constituting the inner walls and inner portions of the RIE apparatus is susceptible to plasma and thus is likely to easily corrode when it is exposed to plasma, the member is usually coated with a protective film made of a material having a high plasma resistance such as yttria or alumina.

However, although the protective film such as yttria is coated onto the member constituting the inner walls and inner portions of the RIE apparatus, the protective film is still likely to degrade due to shedding of particles of the protective film, crack in the protective film and the like.

DETAILED DESCRIPTION

In general, according to one embodiment, a gas supply member includes a gas supply passage having a gas flow channel with a first diameter, an exhaust port connected to one end portion of the gas flow channel and installed at the surface of a downstream side of the gas supply member. An yttria-containing film is provided on a surface constituting the exhaust port and the surface of the downstream side of the gas supply member. Furthermore, at least a part of the surface constituting the exhaust port is formed with a curved surface.

A gas supply member, a plasma treatment method, and a method of forming an yttria-containing film according to the embodiments will be described in detail below with reference to the accompanying drawings. The present invention is not limited to the following embodiments. Furthermore, sectional views of films used in the following embodiments are schematic, and relationship between the thickness and width of layers and the ratio of thicknesses of the layers differ from the actual relationship or ratio.

(First Embodiment)

Figure 1:
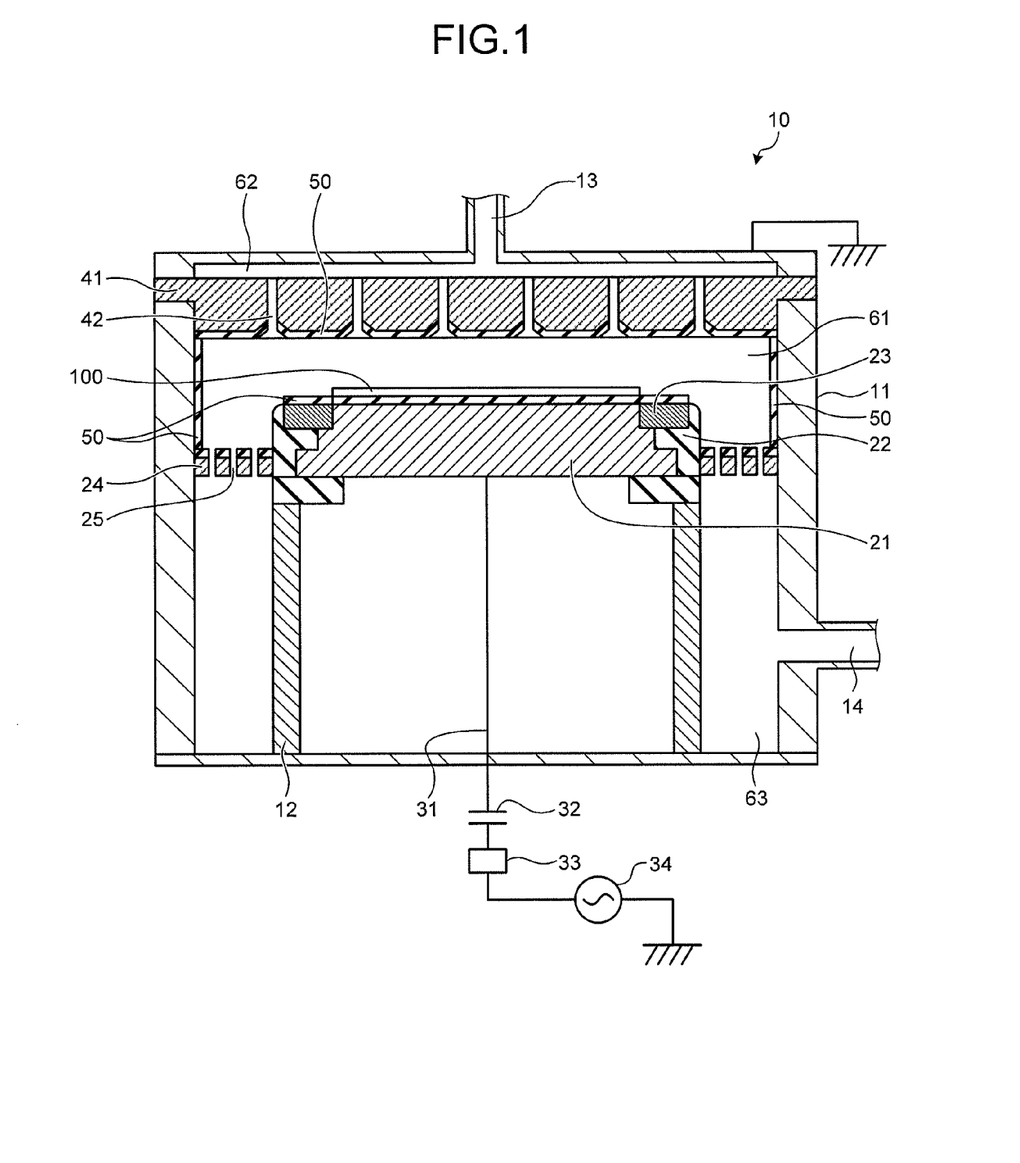
FIG. 1 is a sectional view schematically illustrating an example of the configuration of a plasma treatment apparatus according to a first embodiment.

In a first embodiment, the case in which a film having resistance against the exposure of plasma is applied to the inner wall of a plasma treatment apparatus will be described as an example. FIG. 1 is a sectional view schematically illustrating an example of the configuration of a plasma treatment apparatus according to the first embodiment. Here, a RIE apparatus is used as a plasma treatment apparatus 10. The plasma treatment apparatus 10 includes a chamber 11 airtightly sealed and made of, for example, aluminum. The chamber 11 is grounded.

The chamber 11 is provided therein with a substrate holding unit (support table) 21 that horizontally supports a substrate 100 which is a process target such as a wafer and serves as a lower electrode. The substrate holding unit 21 is provided on the surface thereof with a holding mechanism such as an electrostatic chuck mechanism (not shown) that electrostatically attracts the substrate 100. An insulating ring 22 is provided to cover the edges of lateral side and bottom side of the substrate holding unit 21, and a focus ring 23 is provided on the outer periphery of the upper portion of the substrate holding unit 21 covered by the insulating ring 22. The focus ring 23 is a member provided in order to adjust an electric field such that the electric field is not biased with respect to the vertical direction (direction vertical to a substrate surface) at the edges of the substrate 100 when the substrate 100 is etched.

Furthermore, the substrate holding unit 21 is supported on a support section 12 cylindrically protruding upright from the bottom wall near the center of the chamber 11 via the insulating ring 22 such that the substrate holding unit 21 is positioned near the center of the chamber 11. A baffle plate 24 is provided between the insulating ring 22 and the sidewall of the chamber 11. The baffle plate 24 is formed with a plurality of gas discharge holes 25 passing through the plate in the thickness direction of the plate. Furthermore, a power feed line 31 for supplying radio frequency power is connected to the substrate holding unit 21, and a blocking condenser 32, a matching device 33, and a radio frequency power supply 34 are connected to the power feed line 31. Radio frequency power with a predetermined frequency is supplied from the radio frequency power supply 34 to the substrate holding unit 21.

A shower head 41 serving as an upper electrode is provided above the substrate holding unit 21 to face the substrate holding unit 21 serving as the lower electrode. The shower head 41 is fixed to the sidewall near the upper portion of the chamber 11 while being spaced apart from the substrate holding unit 21 by a predetermined distance, thereby facing the substrate holding unit 21 in parallel to the substrate holding unit 21. With such a structure, the shower head 41 and the substrate holding unit 21 form a pair of parallel flat plate electrodes. Furthermore, the shower head 41 is formed with a plurality of gas supply passages 42 passing through the plate in the thickness direction of the plate.

A gas supply port 13 is provided near the upper portion of the chamber 11 to supply treatment gas used in plasma treatment, and a gas supply apparatus (not shown) is connected to the gas supply port 13 through a pipe.

A gas exhaust port 14 is provided at a lower portion of the chamber 11 below the substrate holding unit 21 and the baffle plate 24, and a vacuum pump (not shown) is connected to the gas exhaust port 14 through a pipe.

As described above, an area of the chamber 11 partitioned by the substrate holding unit 21, the baffle plate 24, and the shower head 41 is a plasma treatment chamber 61, an upper area of the chamber 11 partitioned by the shower head 41 is a gas supply chamber 62, and a lower area of the chamber 11 partitioned by the substrate holding unit 21 and the baffle plate 24 is a gas exhaust chamber 63.

A protective film 50 is formed on the surface of a member constituting the plasma treatment apparatus 10 with such a configuration, which is in contact with a plasma generation area, that is, on the surface of a member constituting the plasma treatment chamber 61. In detail, the protective film 50 including an yttria-containing film (hereinafter, referred to as an yttria film) is formed on the inner wall surface of the chamber 11 which constitutes the plasma treatment chamber 61, the surface of the shower head 41 facing the plasma treatment chamber 61, the surface of the baffle plate 24 facing the plasma treatment chamber 61, the surface of the focus ring 23, and the surface of the substrate holding unit 21 onto which the substrate 100 is loaded.

The overview of processes performed by the plasma treatment apparatus 10 configured as above will be described below. First, the substrate 100 which is a process target is loaded onto the substrate holding unit 21, and the substrate 100 is fixed by the electrostatic chuck mechanism, for example. Next, the inside of the chamber 11 is vacuum-sucked by the vacuum pump (not shown) connected to the gas exhaust port 14. At this time, since the gas exhaust chamber 63 and the plasma treatment chamber 61 are connected to each other through gas discharge holes 25 formed through the baffle plate 24, and the plasma treatment chamber 61 and the gas supply chamber 62 are connected to each other through the gas supply passages 42 of the shower head 41, the entire inside space of the chamber 11 is vacuum-sucked through the vacuum pump connected to the gas exhaust port 14.

Then, when the chamber 11 reaches a predetermined pressure, the treatment gas is supplied from the gas supply apparatus (not shown) to the gas supply chamber 62, and is supplied to the plasma treatment chamber 61 through the gas supply passages 42 of the shower head 41. When pressure in the plasma treatment chamber 61 reaches a predetermined pressure, a radio frequency voltage is applied to the substrate holding unit 21 (the lower electrode) in the state in which the shower head 41 (the upper electrode) is grounded, so that plasma is generated in the plasma treatment chamber 61. Here, since the radio frequency voltage is applied to the lower electrode, potential gradient occurs between the plasma and the substrate 100, so that ions in plasma state are accelerated toward the substrate holding unit 21 and thus an etching process is performed.

Figure 2:
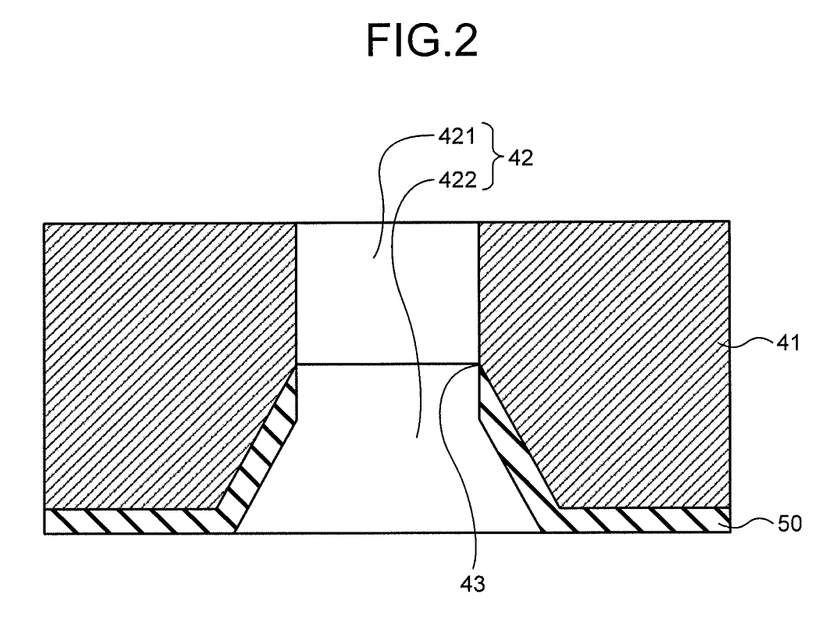
FIG. 2 is a partial sectional view schematically illustrating the shape in the vicinity of an exhaust port of a shower head according the first embodiment.

FIG. 2 is a partial sectional view schematically illustrating the shape in the vicinity of the exhaust port of the shower head according to the first embodiment. The shower head 41 serving as the gas supply member is provided with the gas supply passages 42. The gas supply passages 42, for example, pass through a member constituting the shower head 41 toward the bottom surface (a surface of a downstream side of gas flow) from the top surface of the shower head 41 as illustrated in FIG. 1. The gas supply passage 42 includes a gas flow channel 421 with the first diameter, and an exhaust port 422 with an opening diameter increasing in a tilted manner from one end portion of the gas flow channel 421 so as to be the second diameter which is larger than the first diameter. In an example, the shower head 41 is processed to have a tapered shape in which the diameter of the opening of the shower head 41 increases in the vicinity of the exhaust port 422 of the gas supply passage 42. As the member constituting the shower head 41, for example, aluminum and the like can be used.

In the shower head 41 as described above, the protective film 50 is provided on the formation surface of the exhaust port 422 and in the vicinity of a inflectional section 43 of the surface of the downstream side, which is one main surface of the shower head 41, such that at least a part of the inflectional section 43 is exposed. Here, when a film formation target includes a plurality of surfaces (planes or curved surfaces) which are not parallel to one another, the inflectional section 43 indicates a protruded section formed by bonding one surface serving as a reference to another surface at an angle of more than 90°. Furthermore, in this example, a lateral side of the protective film 50 formed in the vicinity of the inflectional section 43 positioned at the boundary between the gas flow channel 421 and the exhaust port 422 is approximately level with (is flush with) the inner surface of the gas flow channel 421. That is, a ring structure formed by the protective film 50 formed in the vicinity of the inflectional section 43 at the upper portion of the exhaust port 422 has a diameter which is approximately the same as the first diameter. As the protective film 50, an yttria film having a thickness of 50 μm to 100 μm may be used.

Figure 3A:
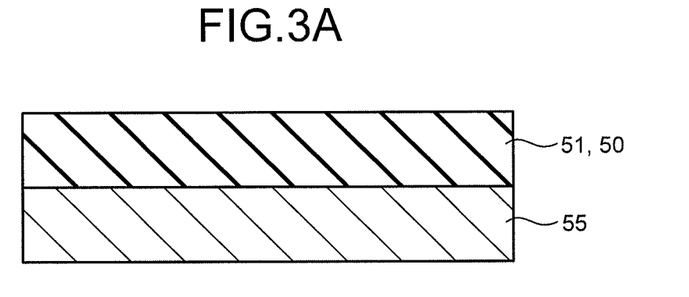
FIG. 3A and FIG. 3B are sectional views schematically illustrating an example of a protective film.
Figure 3B:
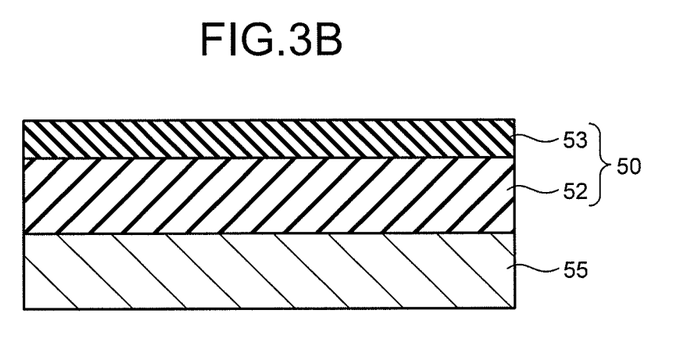

FIG. 3A and FIG. 3B are sectional views schematically illustrating an example of the protective film. As the protective film 50, a general yttria film 51 formed on a constituting member 55 (a film formation target) as illustrated in FIG. 3A may be used. The protective film 50 may include a melt-solidified part (a melt-solidified film) 53 obtained by melting the yttria film 51 of FIG. 3A from the surface in the range of the thickness of the yttria film 51 as illustrated in FIG. 3B. In such a case, the yttria film having the total thickness may be used as the melt solidified part 53, or the protective film 50 may have a stacked structure of the melt solidified part 53 obtained by melting the yttria film 51 from the surface in the range of a predetermined thickness and a non-melt solidified part (a non-melt solidified film) 52. The melt solidified part 53 has a restricted inter-particle gap as compared with the non-melt solidified part 52, is high density, and has a planarized surface. The melt solidified part 53 has a density greater than that of the non-melt solidified part 52. Preferably, the non-melt solidified part 52 has a density range of 2.0 g/cm³ to 4.0 g/cm³, and the melt solidified part 53 has a density range of 4.0 g/cm³ to 5.0 g/cm³.

So far, the case in which the protective film 50 including the yttria film is formed on the shower head 41 made of aluminum has been described. However, an alumina film may be formed on aluminum, and the protective film 50 may be further formed on the alumina film.

Figure 4A:
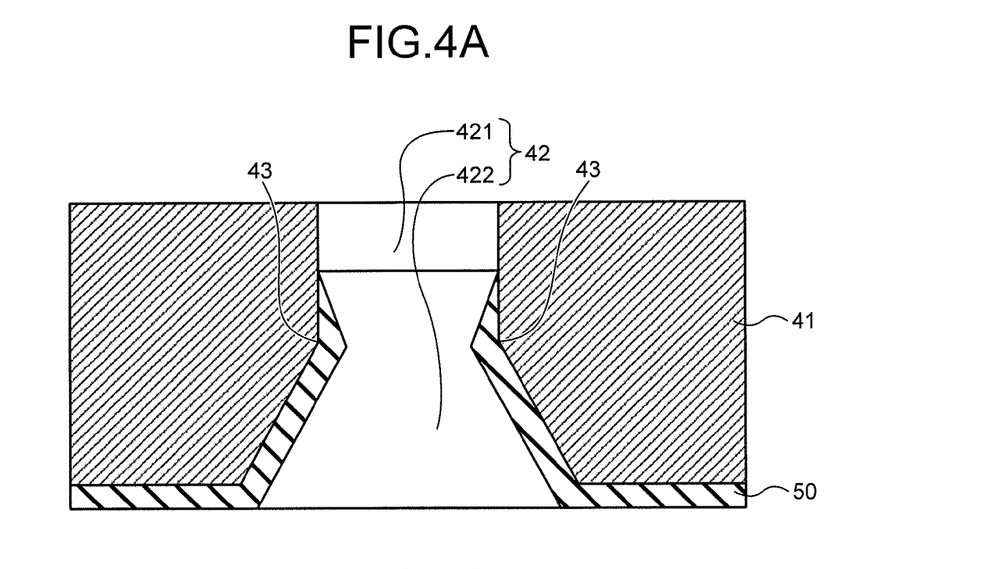
FIG. 4A and FIG. 4B are sectional views schematically illustrating an example of the procedure of a method for forming a protective film according to the first embodiment.

Next, a method of forming the protective film 50 on the shower head 41 will be described. FIG. 4A and FIG. 4B are sectional views schematically illustrating an example of the procedure of the method of forming the protective film according to the first embodiment. First, as illustrated in FIG. 4A, for example, the protective film 50 including the yttria film and having a thickness of 50 µm to 100 µm is formed on the surface (the surface of the side of the exhaust port 422) of the downstream side of the shower head 41 made of aluminum and formed with the gas supply passage 42, and on the inner surface over a part of the gas flow channel 421 from the exhaust port 422. That is, the protective film 50 is formed to cover the inflectional section 43 at which the diameter of the gas supply passage 42 changes. In order to form the yttria film constituting the protective film 50, a spraying method, a chemical vapor deposition (CVD) method, an aerosol deposition method, a cold spraying method, a gas deposition method, an electrostatic powder impact deposition method, an impact sintering method and the like can be used.

Figure 4B:
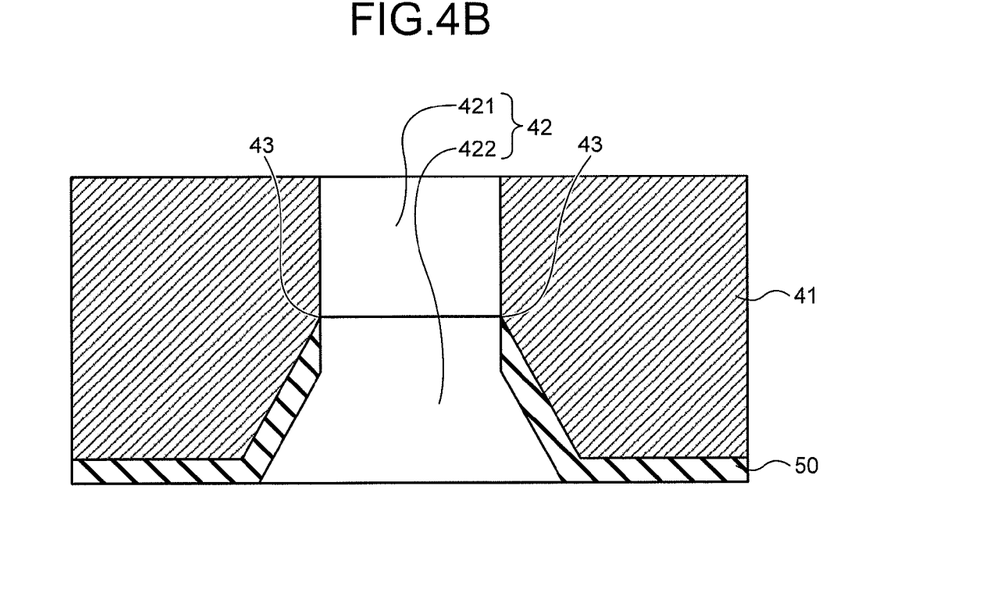

Next, as illustrated in FIG. 4B, the protective film 50 formed on the inner surface of the gas flow channel 421, for example, is removed using polishing and the like. In this way, only one surface (the lower surface), which constitutes the inflectional section 43, of the shower head 41 is coated, and the lateral side of the protective film 50 formed in the vicinity of the inflectional section 43 positioned at the inner surface of the exhaust port 422 is approximately level with the inner surface of the gas flow channel 421. Consequently, the shower head 41 with the structure illustrated in FIG. 2 is achieved.

In addition, in the formation of the protective film 50 illustrated in FIG. 4A, after the yttria film is formed using a spraying method, a CVD method, an aerosol deposition method, a cold spraying method, a gas deposition method, an electrostatic powder impact deposition method, an impact sintering method and the like, the yttria film may be subject to surface treatment, melted in the range of the thickness of a film formed from the surface of the yttria film, and then solidified. As the surface treatment, for example, it is possible to use a method capable of selectively thermally fusing the surface of the yttria film, such as laser annealing treatment or plasma jet treatment.

Figure 5:
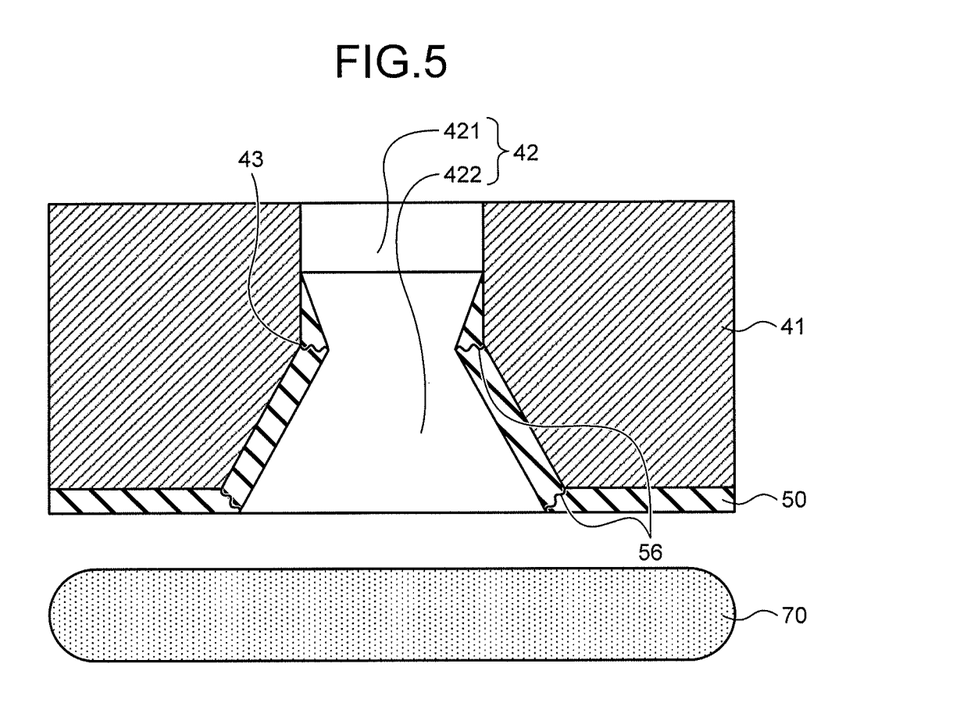
FIG. 5 is a sectional view schematically illustrating the shape in the vicinity of an exhaust port of a conventional shower head.

Hereafter, the effects of the first embodiment will be described by comparing the first embodiment with a comparison example. FIG. 5 is a sectional view schematically illustrating the shape in the vicinity of an exhaust port of a conventional shower head. A shower head 41 serving as a gas supply member, for example, is provided with a gas supply passage 42 which is configured to pass through a member constituting the shower head 41 toward the surface of a downstream side from the upper surface of the shower head 41. The gas supply passage 42 includes a gas flow channel 421 with a first diameter, and an exhaust port 422 with an opening diameter increasing from one end portion of the gas flow channel 421 so as to be a second diameter which is larger than the first diameter. In the example of FIG. 5, a protective film 50 is provided on the surface of the downstream side of the shower head 41, the inner surface of the exhaust port 422, and in the vicinity of the gas flow channel 421 adjacent to the exhaust port 422. That is, the protective film 50 is provided to cover a inflectional section 43 of the gas supply passage 42.

In general, since aluminum has a linear expansion coefficient of about $24 \times 10^{-6}$/° C. and yttria has a linear expansion coefficient of about $7 \times 10^{-6}$/° C., a large difference exists between the two linear expansion coefficients. Therefore, when thermal expansion occurs due to heating during plasma treatment 70, a crack 56 may easily occur in the protective film 50. Specifically, the crack 56 and the like may easily occur in the inflectional section 43 due to the thermal expansion difference between yttria and aluminum during the heating (during the plasma treatment 70).

Meanwhile, in the first embodiment, as illustrated in FIG. 2, the protective film 50 does not extend over the inflectional section 43 of the shower head 41. In a detailed structure example, an inner surface as a part of the gas supply passage 42 formed by the protective film 50 formed in the vicinity of the inflectional section 43 of the exhaust port 422 is approximately level with the inner surface of the gas flow channel 421. In this way, even if thermal expansion difference occurs between the shower head 41 and the protective film 50 due to heating during the plasma treatment, crack does not easily occur in the protective film 50 in the vicinity of the inflectional section 43.

(Second Embodiment)

Figure 6:
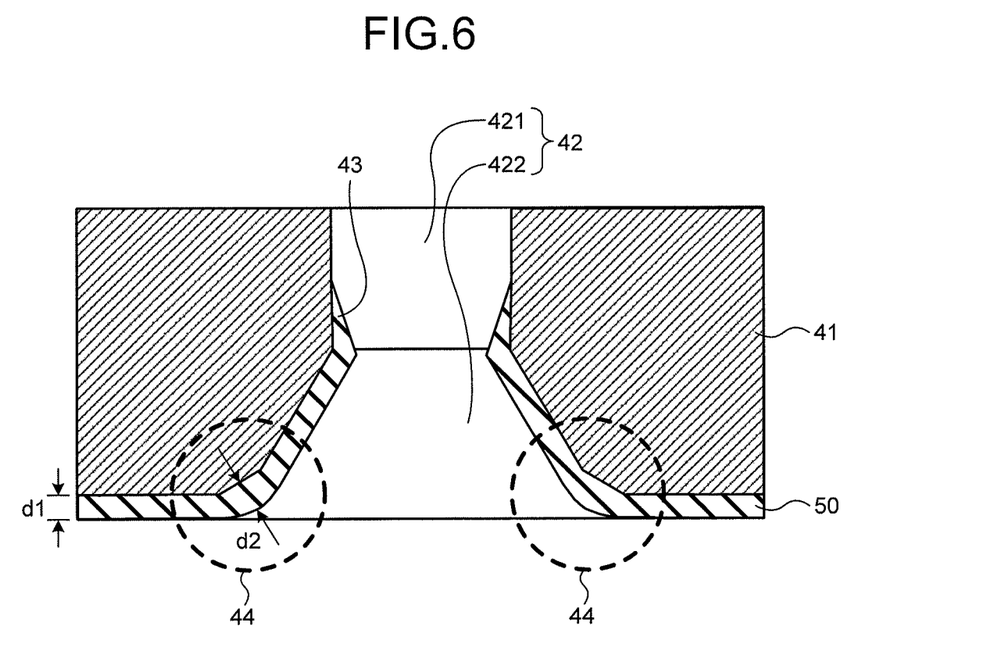
FIG. 6 is a sectional view schematically illustrating the shape in the vicinity of an exhaust port of a shower head according a second embodiment.

FIG. 6 is a sectional view schematically illustrating the shape in the vicinity of an exhaust port of a shower head according to a second embodiment. The second embodiment is different from the first embodiment in that an exhaust port 422 of a gas flow channel 421 of a shower head 41 serving as a base material includes a plurality of surfaces with angles different from each other. Even in the second embodiment, a protective film 50 is formed in the vicinity of the exhaust port 422 and on the surface of the downstream side of the shower head 41 serving as the gas supply member. In the protective film 50 with such a structure, stress concentrated on a corner section 44 is attenuated. In the second embodiment, when a film thickness $d_2$ of the corner section 44 existing in an area coated with the protective film 50 is thicker than a film thickness $d_1$ of another portion, crack does not easily occur because stress is further attenuated. Here, the film thicknesses $d_1$ and $d_2$ are the thicknesses of the protective film 50 in the normal direction at each position of the shower head 41. In detail, preferably, the film thickness $d_1$ at a portion other than the corner section 44 is about 10 µm to about 100 µm, and the film thickness $d_2$ in the vicinity of the corner section 44 is thicker than the film thickness $d_1$ by about one to two times, that is, about 10 µm to about 200 µm.

In addition, as illustrated in this figure, a cross angle of the corner section 44 formed in the exhaust port 422 of the shower head 41 may be large as compared with the case of FIG. 2. Moreover, the protective film 50 can be formed on the above-described shower head 41 using a method the same as that of the first embodiment.

(Third Embodiment)

Figure 7:
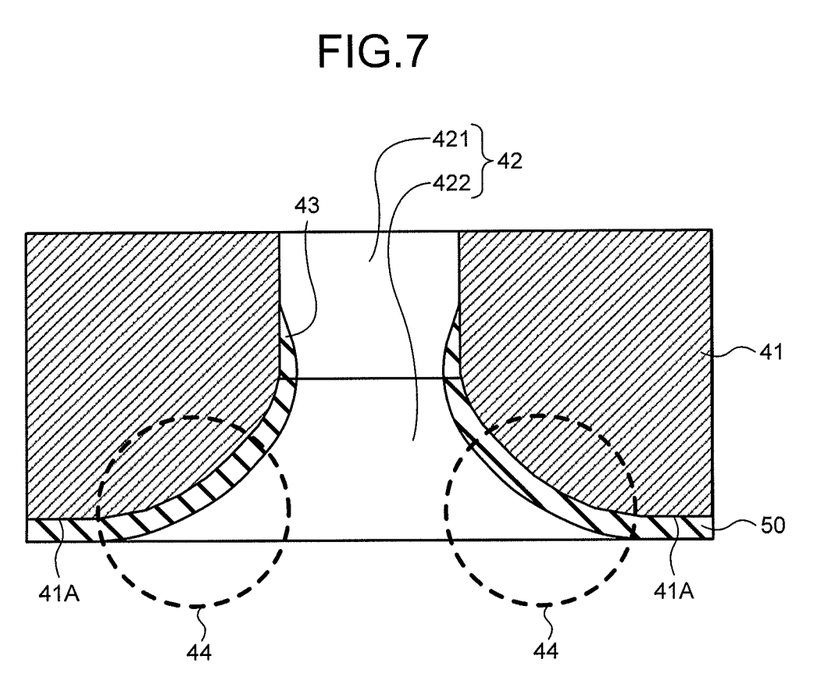
FIG. 7 is a sectional view schematically illustrating the shape in the vicinity of an exhaust port of a shower head according a third embodiment.

FIG. 7 is a sectional view schematically illustrating a third embodiment. In the second embodiment illustrated in FIG. 6, the surface forming the exhaust port 422 of the shower head 41 serving as a base material and the surface (the lower surface) of the downstream side of gas flow are not curved surfaces, and the respective surfaces are connected at a predetermined angle to form the corner section 44. However, in the third embodiment illustrated in FIG. 7, the surface forming a gas flow channel 421 of a shower head 41 serving as a base material and a surface 41A of a downstream side of the shower head 41 are connected to each other by a smooth curved surface. Here, the curved surface of an exhaust port 422 is formed to have a tapered shape such that the opening diameter of the exhaust port 422 increases as it goes far from a connection part with the gas flow channel 421, and the opening diameter at the surface 41A of the downstream side of the shower head 41 is the second diameter which is larger than a first diameter. In the example of FIG. 7, all surfaces constituting the exhaust port 422 are formed by curved surfaces. However, the embodiment is not limited thereto. For example, preferably, a curved surface may be formed near (an area corresponding to the corner section 44 of FIG. 6) at least a connection part of the surfaces constituting the exhaust port 422 and the surface 41A of the downstream side of the shower head 41. In addition, when gas exhausted from the exhaust port 422 generates a plasma phase, the surface 41A of the downstream side of the shower head 41 is a surface constituting the shower head 41 facing an area where plasma is generated. Furthermore, preferably, the curvature radius of the curved surface forming the exhaust port 422 of the shower head 41 illustrated in FIG. 7 is about 100 µm to about 500 µm.

The thickness of a protective film 50 formed on the surface forming the exhaust port 422 of the shower head 41 is approximately constant. Furthermore, the protective film 50 is also formed on the surfaces forming the exhaust port 422 and in the vicinity of the surfaces forming the gas flow channel 421, which are adjacent to the exhaust port 422. Moreover, since the formation surface of the exhaust port 422 of the shower head 41 serving as a base is a curved surface, the protective film 50 is configured to have a curved surface shape according to the formation surface thereof.

In addition, since others are the same as the first embodiment, description thereof will not be repeated. For example, the protective film 50 used is the same as the protective film 50 used in the first embodiment. Furthermore, the protective film 50 may be directly formed on the shower head 41 made of aluminum, or an alumina film may be formed on aluminum and the protective film 50 may be formed on the alumina film. In addition, an yttria film constituting the protective film 50 can also be formed using the method described in the first embodiment.

According to the third embodiment, since the exhaust port 422 of the shower head 41 serving as the base is formed with the curved surface and the protective film 50 is formed on the curved surface, stress concentrating on the corner section 44 is further reduced as compared with the second embodiment, so that crack does not easily occur as compared with the second embodiment.

(Fourth Embodiment)

Figure 8:
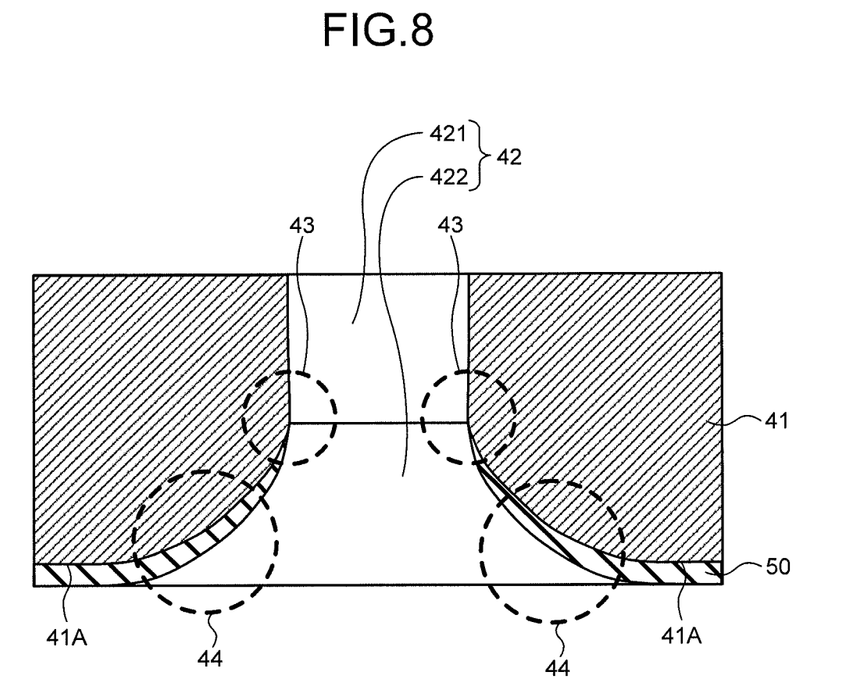
FIG. 8 is a sectional view schematically illustrating the shape in the vicinity of an exhaust port of a shower head according a fourth embodiment.

FIG. 8 is a sectional view schematically illustrating the shape in the vicinity of an exhaust port of a shower head according a fourth embodiment. The fourth embodiment has a structure approximately the same as that of the third embodiment. That is, in the third embodiment, the thickness of the protective film 50 on the exhaust port 422 is approximately constant. However, in the fourth embodiment, the thickness of a protective film 50 is gradually reduced toward the vicinity of the center of an exhaust port 422. Furthermore, the fourth embodiment is different from the third embodiment in that the yttria film is not formed in the side of a gas flow channel 421. In the protective film 50 with such a structure, since stress concentrated on a corner section 44 is further reduced as compared with the second embodiment, crack does not easily occur as compared with the second embodiment. Preferably, the film thickness of a curved part continuously changes from about 10 µm to about 100 µm. Preferably, the curvature radius of the curved surface of a shower head 41 illustrated in FIG. 8 is about 100 µm to about 500 µm similarly to FIG. 7.

In addition, similarly to the third embodiment, the curved surface of the exhaust port 422 is formed to have a tapered shape such that the opening diameter of the exhaust port 422 increases as it goes far from a connection part with the gas flow channel 421, and the opening diameter at a surface 41A of the downstream side of the shower head 41 is a second diameter which is larger than a first diameter. In the example of FIG. 8, all surfaces constituting the exhaust port 422 are formed by curved surfaces. However, the embodiment is not limited thereto. For example, preferably, a curved surface may be formed near (an area corresponding to the corner section 44 of FIG. 6) at least a connection part of the surfaces constituting the exhaust port 422 and the surface 41A of the downstream side of the shower head 41. In addition, when gas exhausted from the exhaust port 422 generates a plasma phase, the surface 41A of the downstream side of the shower head 41 is a surface constituting the shower head 41 facing an area where plasma is generated.

Next, a method for forming the protective film 50 on the shower head according to the fourth embodiment will be described. FIG. 9A to FIG. 9F are a series of sectional views schematically illustrating a first method of forming the protective film in the vicinity of the exhaust port of the shower head illustrated in FIG. 8 according to the fourth embodiment. In the fourth embodiment, the shower head 41 includes the gas flow channel 421 with a first diameter, and the exhaust port 422 with the second diameter at the surface of a downstream side which is a plane while an opening diameter expands from the lower end of the gas flow channel 421 along a smooth surface. The protective film 50 is formed such that the film thickness thereof gradually increases toward the surface of the downstream side of the shower head 41 from the inflectional section 43 positioned at the boundary between the gas flow channel 421 on the formation surface of the exhaust port 422, and the exhaust port 422. Furthermore, the protective film 50 has an approximately uniform thickness on the surface of the downstream side of the shower head 41. Even in such a structure, the protective film 50 is not formed on the gas flow channel 421, and a lateral side of the protective film 50 formed in the vicinity of the inflectional section 43 positioned at the boundary between the gas flow channel 421 and the exhaust port 422 is approximately level with the inner surface of the gas flow channel 421.

Figure 9A:
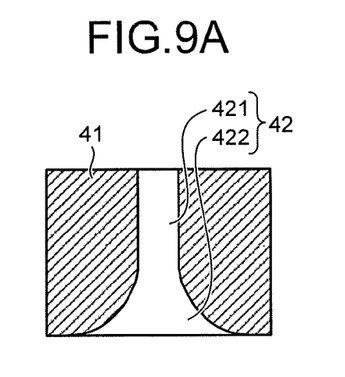
FIG. 9A to FIG. 9F are sectional views schematically illustrating an example of the procedure of a first method for forming a protective film on a shower head according to the fourth embodiment.

FIG. 9A to FIG. 9F are sectional views schematically illustrating an example of the procedure of the first method of forming the protective film on the shower head according to the fourth embodiment. Hereafter, the description will be made by illustrating only a part of the gas supply passage 42 of the shower head 41. First, as illustrated in FIG. 9A, for example, the gas supply passage 42 is formed in a base material made of aluminum. As described above, the gas supply passage 42 includes the gas flow channel 421 with the first diameter, and the exhaust port 422 with the second diameter at the surface of the downstream side which is the plane while the opening diameter expands from the lower end of the gas flow channel 421 along the smooth surface, thereby forming the shower head 41.

Figure 9B:
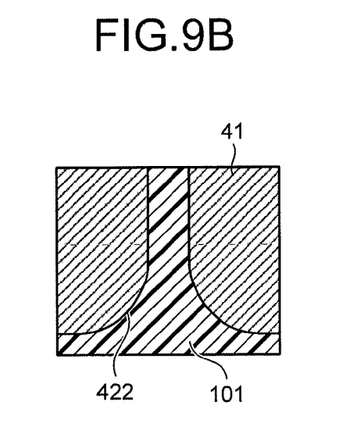
Figure 9C:
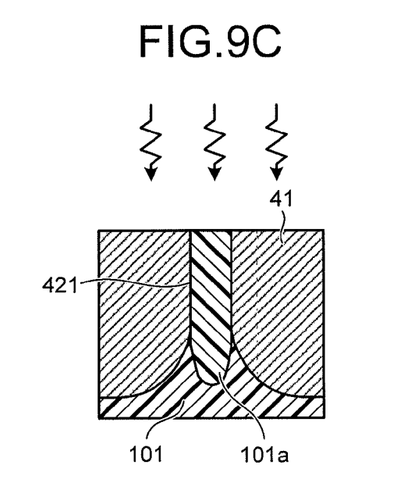
Figure 9D:
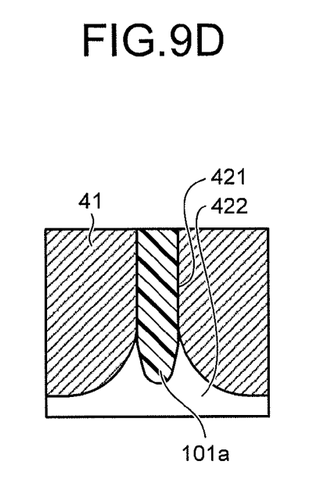

Next, as illustrated in FIG. 9B, negative-type photoresist 101 is coated from the side of the exhaust port 422 of the shower head 41. Then, as illustrated in FIG. 9C, the negative-type photoresist 101 is exposed from the upper surface (the formation surface of the gas flow channel 421) of the shower head 41 using ultraviolet and the like, so that only an exposed part of the negative-type photoresist 101 is cured, resulting in the generation of a sacrificial layer 101a which is a plug member. At this time, only a part of the gas flow channel 421 of the shower head 41 is exposed, so that negative-type photoresist 101 formed in an area (which is not the gas flow channel 421) of the surface of the downstream side of the shower head 41 is not cured because the ultraviolet is blocked by the member of the shower head 41, for example. Thereafter, as illustrated in FIG. 9D, a development process is performed to remove the uncured negative-type photoresist 101. In this way, the sacrificial layer 101a remains in the gas flow channel 421. In addition, the lower end portion of the sacrificial layer 101a protrudes further toward the surface of the downstream side of the shower head 41 than the boundary between the gas flow channel 421 and the exhaust port 422.

Figure 9E:
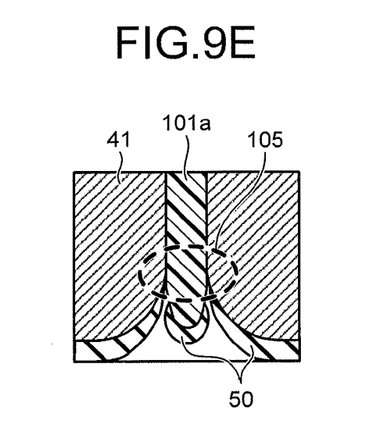

Next, as illustrated in FIG. 9E, the protective film 50 including the yttria film is formed on the formation surface (the surface of the downstream side) of the exhaust port 422 of the shower head 41 provided with the sacrificial layer 101a. In order to form the yttria film constituting the protective film 50, it is possible to use a spraying method, a CVD method, an aerosol deposition method, a cold spraying method, a gas deposition method, an electrostatic powder impact deposition method, an impact sintering method and the like. Here, the protective film 50 having a thickness of 50 μm to 100 μm is formed on the surface of the downstream side of the shower head 41. However, the thickness of the protective film 50 is gradually reduced toward the vicinity 105 of the center of the exhaust port 422 because yttria particles do not easily reach the vicinity 105 of the center. Furthermore, the protective film 50 is also formed in the vicinity of the upper surface of the sacrificial layer 101a.

Figure 9F:
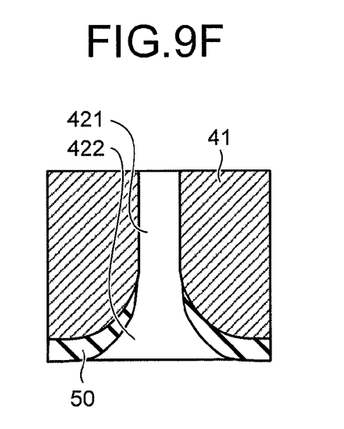

Next, as illustrated in FIG. 9F, the sacrificial layer 101a is removed using a method such as a resist stripping technique. In this way, the protective film 50 is formed on both the surfaces constituting the exhaust port 422 of the shower head 41 and the surface of the downstream side of the shower head 41.

The first formation method described above can also be applied to the first to third embodiments.

Furthermore, in order to form the protective film 50 on the shower head 41 as illustrated in FIG. 8, a method other than the first formation method can also be used. Hereafter, a case for processing the vicinity of the exhaust port 422 of the shower head 41 illustrated in FIG. 8 according to the fourth embodiment by using a method different from the first formation method will be described.

Figure 10A:
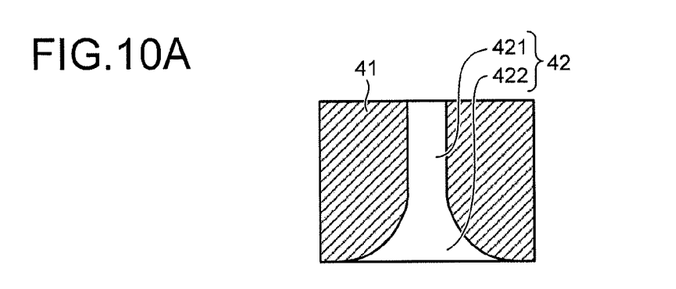
FIG. 10A to FIG. 10D are sectional views schematically illustrating an example of the procedure of a second method for forming a protective film on a shower head according to the fourth embodiment.

FIG. 10A to FIG. 10D are sectional views schematically illustrating an example of the procedure of a second method of forming the protective film on the shower head illustrated in FIG. 8 according to the fourth embodiment. Hereafter, the description will be made by illustrating only a part of the gas supply passage 42 of the shower head 41. First, as illustrated in FIG. 10A, for example, the gas supply passage 42 is formed in a base material made of aluminum. As described above, the gas supply passage 42 includes the gas flow channel 421 with the first diameter, and the exhaust port 422 with the second diameter at the surface of the downstream side which is the plane while the opening diameter expands from the lower end of the gas flow channel 421 along the smooth surface, thereby forming the shower head 41.

Figure 10B:
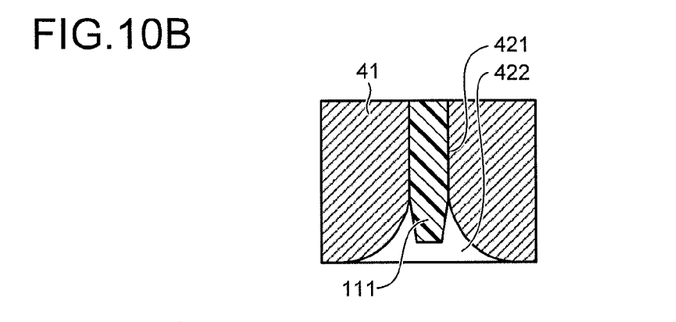

Next, as illustrated in FIG. 10B, a tool 111 serving as a plug member is inserted into the gas flow channel 421. The tool 111 has a diameter approximately the same as the first diameter of the gas flow channel 421. The tool 111 is inserted to slightly protrude toward the exhaust port 422 from the surface (the formation side of the exhaust port 422) of the downstream side of the shower head 41. At this time, the gas flow channel 421 of the shower head 41 is closed by the tool 111, and the lower end portion of the tool 111 is fixed to slightly protrude further toward the surface (the side where the opening diameter of the exhaust port 422 is expanded) of the downstream side than the boundary between the gas flow channel 421 and the exhaust port 422.

Figure 10C:
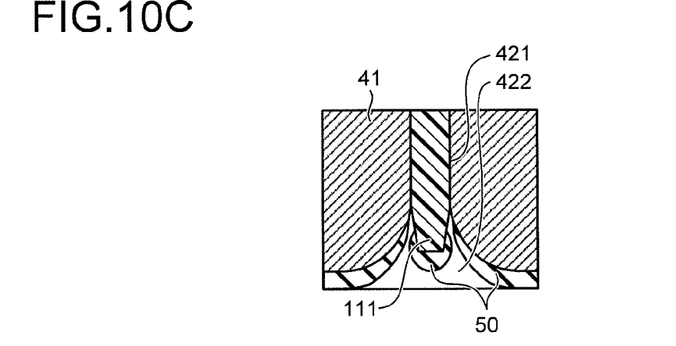

Then, as illustrated in FIG. 10C, the protective film 50 including the yttria film is formed on the formation surface (the surface of the downstream side) of the exhaust port 422 of the shower head 41 including the tool 111 inserted thereto. In order to form the yttria film constituting the protective film 50, it is possible to use a spraying method, a CVD method, an aerosol deposition method, a cold spraying method, a gas deposition method, an electrostatic powder impact deposition method, an impact sintering method and the like. Here, the protective film 50 having a thickness of 50 μm to 100 μm is formed on the surface of the downstream side of the shower head 41. However, the thickness of the protective film 50 is gradually reduced toward the vicinity of the center of the exhaust port 422 because yttria particles do not easily reach the vicinity. Furthermore, since the gas flow channel 421 is closed by the tool 111, the protective film 50 is not formed in the gas flow channel 421, but formed in the vicinity of the upper surface of the tool 111.

Figure 10D:
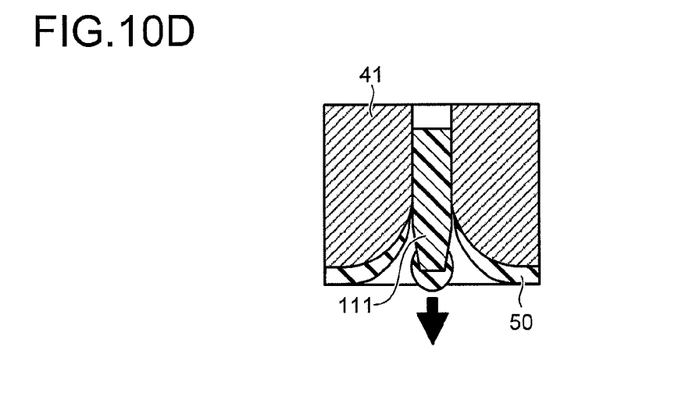

Thereafter, as illustrated in FIG. 10D, the tool 111 is removed. Here, the tool 111 is removed from the surface of the downstream side of the shower head 41 such that the protective film 50 is not damaged. In this way, the protective film 50 is formed on both the surfaces constituting the exhaust port 422 of the shower head 41 and the surface of the downstream side of the shower head 41.

In the second formation method, after the gas flow channel 421 is closed by the tool 111, since the protective film 50 is formed on both the surface of the downstream side of the shower head 41 and the formation surface of the exhaust port 422, and then the tool 111 is pulled out from the gas flow channel 421, it is possible to easily form the protective film 50, as compared with the first formation method. Furthermore, since the tool 111 can be repeatedly used a plurality of times, it is possible to form the protective film 50 at a low cost, as compared with the case of using resist in the first formation method.

In addition, in the first and second formation methods, the case, in which a lateral side as a part of the gas supply passage 42 formed by the protective film 50 in the vicinity of the inflectional section 43 positioned at the boundary between the gas flow channel 421 and the exhaust port 422 is level with the inner surface of the gas flow channel 421 constituting the shower head 41, has been described with reference to the figures. However, the embodiment is not limited thereto. As described above, the protective film 50 may be formed such that at least a part of the inflectional section 43 is exposed.

In the fourth embodiment, at the time of plasma treatment, stress concentration is reduced in the vicinity of the inflectional section 43 and the corner section 44 where stress may be easily concentrated due to the difference of linear expansion coefficients between the shower head 41 and the protective film 50, and the occurrence of defect such as crack is prevented. As a consequence, it is possible to prevent dust including yttria from being generated from the protective film 50. Furthermore, since additional processing such as polishing described in the first embodiment is not necessary, the manufacturing cost is reduced, crack of the protective film 50, which may occur at the time of polishing, and dusting, which occurs at the time of polishing, are not problematic.

Furthermore, in the first to fourth embodiments, the protective film 50 formed on the shower head 41 of the RIE apparatus has been described as an example. However, the embodiments are not limited thereto. For example, it is possible to form the protective film 50 according to the first to fourth embodiments on members, other than the shower head 41, such as the inner wall of the chamber 11, the baffle plate 24, the focus ring 23, the substrate holding unit 21 for holding a plasma treatment target, and the like.

In addition, in the above description, the RIE apparatus has been described as an example of the plasma treatment apparatus 10. However, it is possible to apply the above-described embodiments to all processing apparatuses such as a resist stripping apparatus, a chemical dry etching (CDE) apparatus or a CVD apparatus, and all semiconductor manufacturing apparatuses.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A gas supply member forming an electrode in a chamber, the gas supply member comprising:
    an electrode constituting member provided with a gas supply passage, the gas supply passage including a gas flow channel and an exhaust port, the exhaust port being connected to a first connection part which is one end portion of the gas flow channel and being provided to a downstream side of the electrode constituting member, the electrode constituting member having a first flat surface at the downstream side; and
    an yttria-containing film coating a part of the electrode constituting member, wherein
    at least a part of a surface constituting the exhaust port of the electrode constituting member is formed with a curved surface,
    the surface constituting the exhaust port and the first flat surface at the downstream side of the electrode constituting member are connected to each other by a smooth curved surface continuously,
    a diameter of the exhaust port increases as it goes far from the first connection part with the gas flow channel,
    a diameter of the gas flow channel is entirely constant from the one end portion connected to the exhaust portion to the other end portion intersecting with a second flat surface at an upstream side of the electrode constituting member, the second flat surface being parallel with the first flat surface, and
    the yttria-containing film is formed on the surface constituting the exhaust port and on the first flat surface at the downstream side of the electrode constituting member and is not formed on an upstream side of the first connection part, the yttria-containing film having a curved surface.

2. The gas supply member according to claim 1, wherein the curved surface is formed near a second connection part between the surface constituting the exhaust port and the first flat surface of the downstream side of the electrode constituting member.

3. The gas supply member according to claim 1, wherein a thickness of the yttria-containing film decreases toward the first connection part.

4. The gas supply member according to claim 1, wherein the gas flow channel has a first diameter, and an opening diameter at the first flat surface of the downstream side of the electrode constituting member is a second diameter which is larger than the first diameter.

5. The gas supply member according to claim 1, wherein, when a gas exhausted from the exhaust port and changed in the plasma state, the first flat surface of the downstream side of the electrode constituting member faces the gas in the plasma state.

6. The gas supply member according to claim 1, wherein an alumina film is formed on the electrode constituting member, and the yttria-containing film is formed on the alumina film.

7. The gas supply member according to claim 1, wherein the yttria-containing film has a melt-solidified part obtained by melting and solidifying the yttria-containing film from the surface in a range of a thickness of the yttria-containing film.

8. The gas supply member according to claim 1, wherein the first flat surface at the downstream side of the electrode constituting member is parallel to a surface of a processing target to be set in the chamber, the surface of processing target being set to face the electrode constituting member in the chamber.

9. The gas supply member according to claim 1, wherein a thickness at an end portion of an upstream side of the yttria-containing film gradually decreases toward the first connection part.

10. The gas supply member according to claim 1, wherein the gas flow channel has a first diameter, the exhaust port has a smooth curved surface between the first connection part and the first flat surface at the downstream side of the electrode constituting member, and a thickness of the yttria-containing film on the exhaust port decreases toward the first connection part.

11. The gas supply member according to claim 1, wherein, in a longitudinal section of the gas supply passage, the first connection part is a boundary between a smooth curved portion of the exhaust port and a linear portion of the gas flow channel.

12. The gas supply member according to claim 11, wherein the yttria-containing film does not have a linear surface in the gas supply passage.

13. The gas supply member according to claim 1, wherein the electrode constituting member is made of aluminum.

14. The gas supply member according to claim 1, wherein the curved surface is formed near a second connection part between the surface constituting the exhaust port and the first flat surface at the downstream side of the electrode constituting member.

15. The gas supply member according to claim 13, wherein a thickness of the yttria-containing film decreases toward the first connection part.

* * * * *